(12) United States Patent
Mather et al.

(10) Patent No.: US 10,012,707 B2
(45) Date of Patent: Jul. 3, 2018

(54) MAGNETIC FIELD SENSOR WITH 3-AXES SELF TEST

(71) Applicant: EVERSPIN TECHNOLOGIES, INC., Chandler, AZ (US)

(72) Inventors: Phillip G. Mather, Phoenix, AZ (US); Anuraag Mohan, Fremont, CA (US); Guido De Sandre, Brugherio (IT)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/140,137

(22) Filed: Apr. 27, 2016

(65) Prior Publication Data

US 2016/0320462 A1 Nov. 3, 2016

Related U.S. Application Data

(60) Provisional application No. 62/154,285, filed on Apr. 29, 2015.

(51) Int. Cl.
*G01R 33/09* (2006.01)
*G01R 33/00* (2006.01)
*G01R 33/02* (2006.01)

(52) U.S. Cl.
CPC ........ *G01R 33/098* (2013.01); *G01R 33/0011* (2013.01); *G01R 33/0023* (2013.01); *G01R 33/0206* (2013.01)

(58) Field of Classification Search
None
See application file for complete search history.

(56) References Cited

U.S. PATENT DOCUMENTS

| | | | | |
|---|---|---|---|---|
| 2009/0115405 A1* | 5/2009 | Guo | ............... | G01D 5/145 324/207.14 |
| 2010/0213933 A1* | 8/2010 | Mather | ............... | G01R 33/098 324/252 |
| 2011/0169488 A1* | 7/2011 | Mather | ............... | G01R 33/098 324/252 |
| 2012/0212217 A1* | 8/2012 | Engel | ............... | G01R 33/098 324/252 |
| 2013/0221949 A1* | 8/2013 | Liu | ............... | G01R 33/0011 324/202 |
| 2013/0300402 A1 | 11/2013 | Liu et al. | | |

* cited by examiner

*Primary Examiner* — Melissa Koval
*Assistant Examiner* — Nasima Monsur
(74) *Attorney, Agent, or Firm* — Bookoff McAndrews, PLLC

(57) ABSTRACT

A magnetic field sensor includes built-in self-test coils in a configuration to provide magnetic field stimulation along three axes, with a high field factor, and thus, reduce a power budget of the sensor and physical size of the self-test coils. The magnetic field sensor comprises a first bridge circuit including a plurality of sense elements configured to sense a magnetic field. The magnetic field sensor further comprises re-configurable self-test current lines coupled to a self-test source to perform high field, high power wafer and die level testing and trim, as well as low power in-situ characterization and calibration of the sensor. The self-test current lines may be routed to form a coil with multiple turns around the TMR elements.

20 Claims, 5 Drawing Sheets

X/Y AXIS CONFIGURATION

X/Y AXIS CONFIGURATION

Z AXIS CONFIGURATION

Z AXIS CONFIGURATION

MAGNETIC FIELD SENSOR WITH 3-AXES SELF TEST

CROSS REFERENCE TO RELATED APPLICATIONS

This application claims the benefit of priority to U.S. Provisional Application No. 62/154,285, filed Apr. 29, 2015, the entire contents of which is herein incorporated by reference.

TECHNICAL FIELD

The present inventions relate generally to the field of magnetic field sensors and more particularly to the field of magnetic field sensors with high field factor self-test coils.

BACKGROUND OF THE INVENTION

Magnetic field sensors have been commonly used in various electronic devices, such as computers, laptops, media players, smart phones, etc. There are several techniques/devices that can be used for detecting a magnetic field. Tunneling Magnetoresistance (TMR) is a promising magnetic sensing technology for handset applications due to its advantages in sensitivity, power, and process cost compared with other magnetic sensors. Another closely related technology in magnetic field sensing is Giant Magnetoresistance (GMR).

A TMR element is composed of two ferromagnetic layers separated by a non-magnetic, insulating tunnel barrier. One layer has a magnetization direction that is "free" to rotate in a magnetic field. The other layer has a "fixed," reference magnetization that does not rotate when in a magnetic field of moderate to low strength that is of sensing interest. If the magnetization directions of the two layers are parallel to each other, the electrical resistance of the tunnel barrier is low. Conversely, when the magnetization directions are anti-parallel, the resistance is high. A magnetic field sensor based on TMR therefore converts magnetic field into electrical signal by a change in electrical resistance due to the changing angle of the magnetic free layer relative to the fixed layer in response to the field.

A TMR element may also comprise a reset current line and a self-test current line for measurement preparation, calibration, and self-test functions. The current line and self-test current line need power inputs for normal operation to generate either a reset magnetic field or a self-test magnetic field. Typical magnetic sensors for mobile electronic applications have restrictions for physical size and power consumptions. Therefore, it would be desirable to have a system, device, and method to effectively minimize power consumption as well as physical size for TMR sense elements.

SUMMARY OF THE INVENTION

Certain embodiments of the inventions provide for systems, devices, and methods to construct magnetic field sensors with high field factor self-test coils.

According to various embodiments of the inventions, a TMR magnetic field sensor utilizes a self-test coil in a configuration to provide a high field factor, and thus, reduce a power budget of the sensor and physical size of the self-test coils. The TMR field sensor comprises a first bridge circuit including a plurality of TMR elements configured to sense a magnetic field. Each TMR element comprises a first ferromagnetic layer (free layer) and a second ferromagnetic layer (fixed layer) separated by a non-magnetic, insulating tunnel barrier. The TMR field sensor further comprises one or more self-test current lines coupled to a self-test source to perform, e.g., in-situ characterization and calibration of the sensor. The self-test current lines may be routed to form a coil with multiple turns around the TMR elements.

In certain embodiments, the self-test current lines are arranged in the same plane as a flux guide within a Z-axis sense element cell. This leads to a higher out-of-plane field that is coupled in the flux guide, leading to a higher field factor for the self-test, as well as a more accurate self-test function, as in-plane fields are not present at the flux guide center. In addition, self-test line pairs are not required to be centered around the sense element, thus providing flexibility for sensor design. The self-test coil is designed to achieve a constant field over the sensor area for all sense elements in a Z-axis bridge, while ensuring that the self-test current and voltage are within limits of the drive circuit process limitations. The bridge may intrinsically subtract out a common mode field, leaving only the effects of the out-of-plane field.

The self-test coil in the sensor is used to generate controlled fields that are used to test the sensor performance in wafer/die level testing. These tests require self-test fields that may exceed the linear or operating range of the sensors. The self-test coil in the sensor may also be used in-situ, (in a final application) to calibrate the sensor and mitigate the effects of any spurious offset fields. The self-test field in this mode is a fraction of the full range of the sensor, and there are severe power constraints on the system as the sensor could be deployed in a power sensitive device. The design requirements from the self-test coil for the two modes of operation are different and using the same self-test coil for both modes imposes severe constraints on self-test coil design due to system power/voltage limits. In certain embodiments, the self-test coil is split into multiple interleaved coils that are connected in parallel. A fraction of the coils is used during a calibration routine, when there are severe power constraints on the system. All of the coils are used during wafer/die level testing when generating a relatively higher field is crucial and there are no constraints on the voltage/power budget.

While the present inventions are discussed below using TMR magnetic fields sensors having TMR elements, all aspects of the inventions will directly apply to devices based on giant magnetoresistance (GMR) technology as well. The inventions disclosed here also apply to any magnetic sensors that utilize self-test coils. The magnetic sensors may include anisotropic magnetoresistance (AMR), Fluxgate, Hall sensors, or the like. For simplicity and clarity, the inventions will be described in more detail below using TMR technology as an example.

BRIEF DESCRIPTION OF THE DRAWINGS

Reference will be made to exemplary embodiments of the present inventions that are illustrated in the accompanying figures. Those figures are intended to be illustrative, rather than limiting. Although the present inventions are generally described in the context of those embodiments, it is not intended by so doing to limit the scope of the present inventions to the particular features of the embodiments depicted and described.

Figure 1:
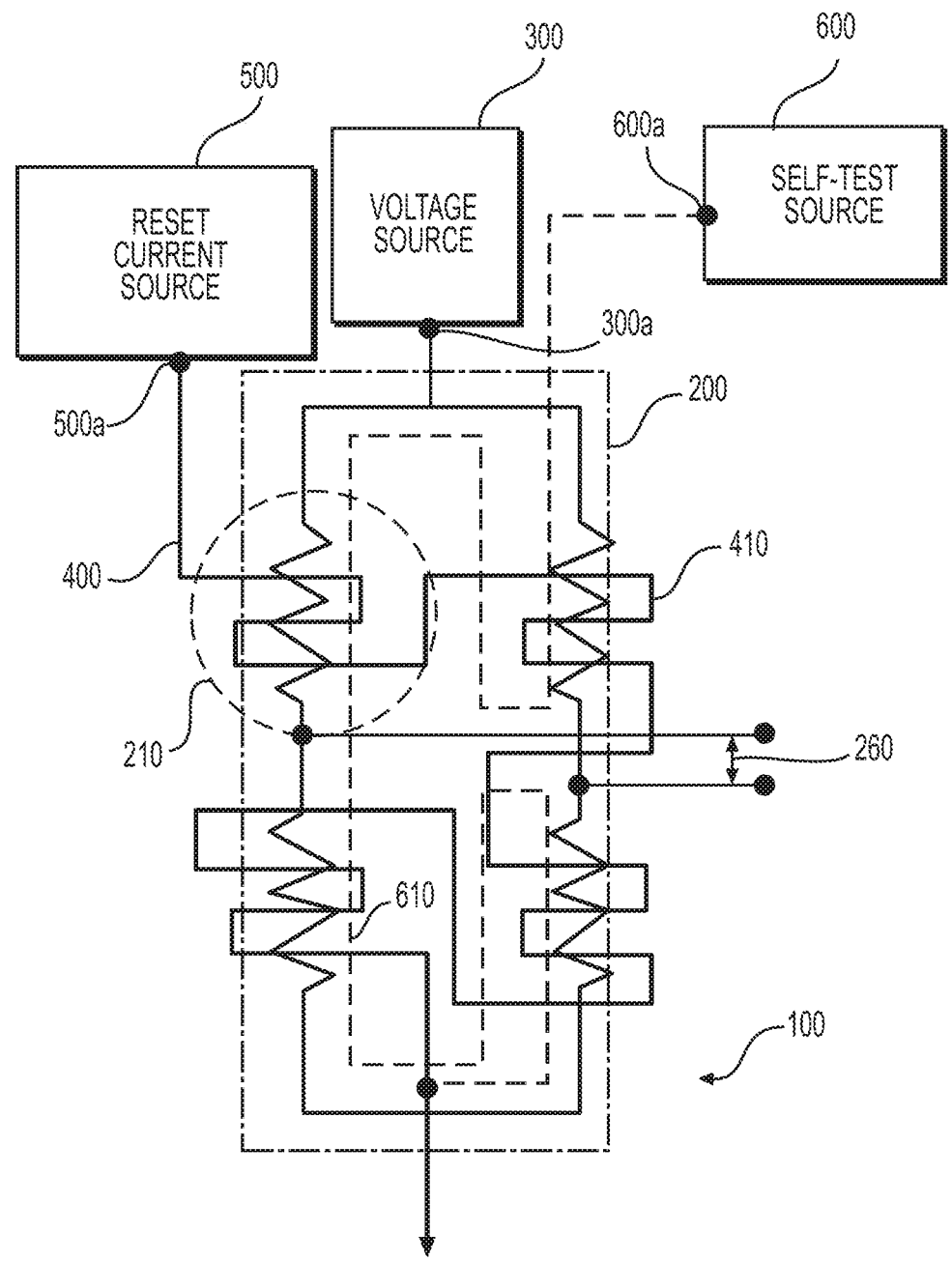
FIG. 1 depicts an exemplary structure overview of a TMR magnetic field sensor according to various embodiments of the inventions.

One skilled in the art will recognize that various implementations and embodiments of the inventions may be practiced in accordance with the specification. All of these implementations and embodiments are intended to be included within the scope of the inventions.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION OF THE PREFERRED EMBODIMENTS

In the following description, for the purpose of explanation, specific details are set forth in order to provide an understanding of the present invention. The present inventions may, however, be practiced without some or all of these details. The embodiments of the present inventions described below may be incorporated into a number of different electrical components, circuits, devices, and systems. Structures and devices shown in block diagram are illustrative of exemplary embodiments of the present inventions and are not to be used as a pretext by which to obscure broad teachings of the present inventions. Connections between components within the figures are not intended to be limited to direct connections. Rather, connections between components may be modified, re-formatted, rerouted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present inventions. Thus, the appearance of the phrase, "in one embodiment," in different places in the specification does not constitute a plurality of references to a single embodiment of the present inventions.

Various embodiments of the inventions are used for systems, devices, and methods to construct magnetic field sensors with high field factor self-test coils and low power consumption. The TMR magnetic field sensors, the TMR element(s), and self-test coils therein, may be integrated on a single component or contain discrete components. Furthermore, embodiments of the inventions are applicable to a diverse set of techniques and methods.

As mentioned above, the magnetic field sensors as claimed herein may mean one or more of TMR magnetic fields sensors, GMR magnetic field sensors, AMR magnetic field sensors, Fluxgate magnetic field sensors, and/or Hall magnetic field sensors with a flux concentrator. Further, magnetoresistance sense elements as claimed herein may mean one or more of TMR elements, GMR elements, AMR elements, Fluxgate elements, and/or Hall elements with flux concentrators.

FIG. 1 shows a schematic diagram of a TMR magnetic field sensor 100, according to various embodiments of the inventions. The magnetic field sensor 100 comprises a first bridge circuit 200 powered by a voltage source 300 connected via a voltage source connection 300a, and a second circuit 400 powered by an optional reset field source 500, which may be a current source, connected via a reset field source connection 500a. The first bridge circuit 200 comprises a plurality of TMR transducer legs 210. The bridge circuit 200 may be a half bridge circuit, a full bridge circuit, or any combinations thereof. In one embodiment, the bridge circuit 200 is a Wheatstone bridge circuit having two circuit branches with a bridge output signal 260 between the two branches at some intermediate point along the branches. The TMR transducer leg 210 electrically functions as a resistor with its resistance value variable in response to internal and external magnetic fields. Each transducer leg 210 may have at least one corresponding built-in current line 410 coupled to the reset field source 500, via the reset field source connection 500a.

The magnetic field sensor 100 also comprises a plurality of self-test current lines 610 forming a self-test circuit powered by a self-test source 600, which may be a current source connected to the self-test current lines 610 via a self-test source connection 600a. Each TMR transducer leg 210 may have at least one corresponding built-in current line 410 coupled to the reset field source 500, and at least one corresponding built-in self-test current line 610 coupled to the self-test source 600

The self-test circuit is typically used for a calibration of sensitivity and a measure of functionality. When measurements at different self-test currents are combined with measurements at different reset current values, it becomes possible to extract the intrinsic sensor electrical offset for a more accurate external magnetic field measurement.

Figure 2:
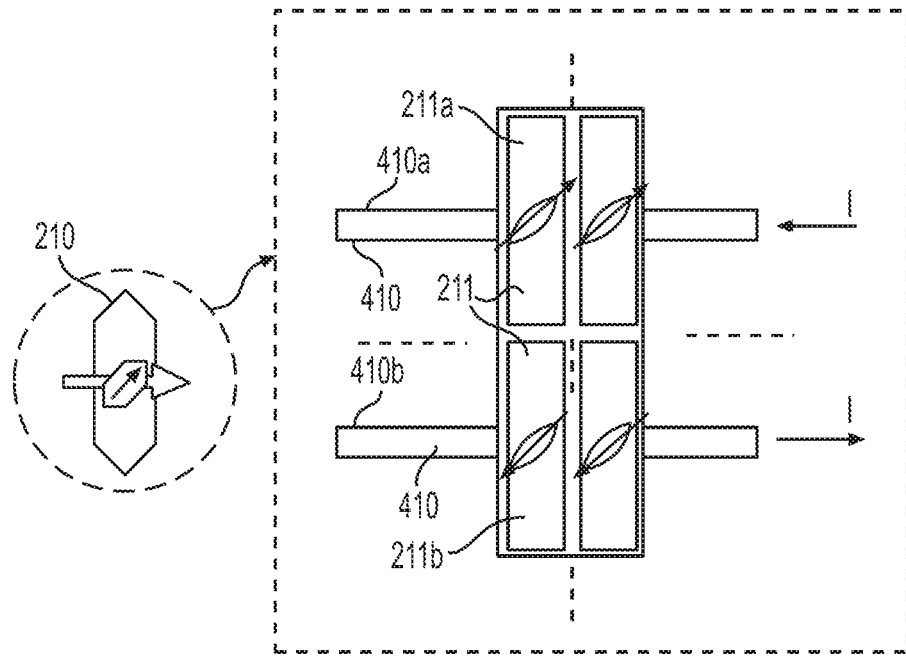
FIG. 2 depicts an exemplary structure overview of a TMR transducer leg of a TMR magnetic field sensor, with multiple sense element cells according to various embodiments of the inventions.

FIG. 2 shows an exemplary structure overview of a TMR transducer leg 210, with multiple sense elements 211, according to various embodiments of the inventions. Each TMR transducer leg 210 comprises an array of multiple active TMR sense elements 211a and 211b, preferably arranged in a matrix layout. In one embodiment, each TMR transducer leg 210 comprises an array of 24×24 TMR sense elements 211, which is approximately 100×100 um$^2$ in size overall. The current flow in current lines 410a and 410b of each TMR sense element 211 may or may not be the same direction. In one embodiment, a TMR sense element 211a may have the opposite current direction relative to a current line of a neighbor TMR sense element 211b.

Figure 3:
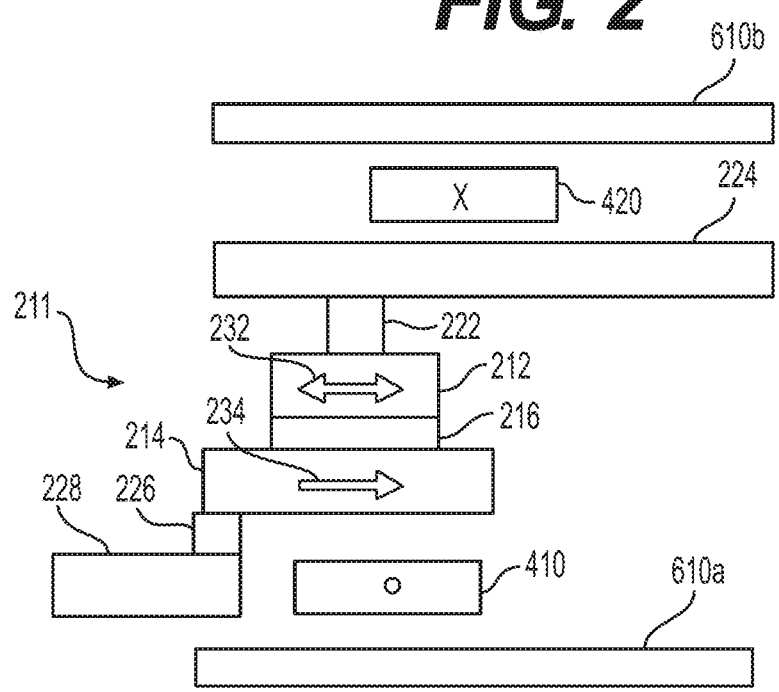
FIG. 3 depicts a cross-section view of a single TMR sense element cell according to various embodiments of the inventions.

FIG. 3 illustrates a cross-section view of a single TMR sense element 211, according to various embodiments of the inventions. The TMR sense element 211 is composed of a first ferromagnetic layer 212 (free layer) and a second ferromagnetic layer 214 (fixed layer) separated by a non-magnetic, insulating tunnel barrier 216. In one embodiment, the first layer 212 has a magnetization direction 232 that is free to rotate in a magnetic field. The second layer 214 has a fixed reference magnetization direction 234 that does not rotate when in a magnetic field. If the magnetization directions of the two layers are parallel to each other, the electrical resistance of the tunnel barrier 216 is relatively low. Conversely, when the magnetization directions are antiparallel, the resistance is relatively higher.

The TMR sense element 211 therefore converts a magnetic field into an electrical signal by changing the electrical resistance due to a changing angle of the magnetization direction 232 of the magnetic free layer relative to the reference magnetization direction 234 of the fixed layer in response to the field. The ferromagnetic layers 212 and 214 may be formed from any suitable ferromagnetic material, such as Ni, Fe, Co, or their alloys. The insulating tunnel barrier 216 may be composed of insulator materials such as AlOx, MgOx, ZrOx, TiOx, HfOx, or any combinations thereof.

In one embodiment, the first ferromagnetic layer 212 is connected to a first conductive line 224 by a first contact 222, and the second ferromagnetic layer 214 is connected to a second conductive line 228 by a second contact 226, which may contact from above as well as below the second ferromagnetic layer 214.

In one embodiment, the second circuit 400 comprises a plurality of built-in current lines 410 located adjacent to the second ferromagnetic layer 214 of each TMR sense element 211. The current lines 410 are connected such that a current pulse is applied to the current line for each TMR sense element 211. The connection of the current lines 410 may be sequential, serial, or time multiplexed according to various embodiments. In another embodiment, the second circuit 400 may also comprise a second plurality of built-in current lines 420 located adjacent to the first ferromagnetic layer 212. The first ferromagnetic layer 212 is patterned into a shape that has a long axis and a short axis. In a zero magnetic field, the magnetization direction of the first ferromagnetic layer 212 lies along the long axis of the element 210, and can be directed in either of the two directions along this axis. By applying a control current signal to the current line 410 and/or the current line 420, an induced magnetic field is generated in an ambient area surrounding the current line. Since the first layer 212 has a magnetization direction 232 that is free to rotate and switch, the magnetization direction 232 will switch to along the direction projected on its axis by the induced magnetic field. As an exemplary illustration in FIG. 3, when the current in the current line 410 has a direction pointing outward (relative to the page) and the current in the current line 420 has a direction pointing inward (relative to the page), the magnetization direction 232 points leftward, which is has a component that is negatively aligned to the reference magnetization direction 234, and will switch the magnetization direction 232 of the free layer to the left; when the current in the current line 410 has a direction pointing inward and/or the current in the current line 420 has a direction pointing outward, the magnetization direction 232 points rightward, which has a component that is positively aligned to the reference magnetization direction 234, and will switch the magnetization direction 232 of the free layer to the right.

In one embodiment, a self-test circuit may include one or more self-test current lines 610 located adjacent to the TMR sense element(s) 211. For example, self-test current He 610a is located, disposed, or deposited below the built-in current line 410, and a self-test current line 610b is located, disposed, or deposited above the built-in current line 420. The self-test lines 610a and 610b are metal conductors that generate a magnetic field when a current is passed through. The self-test current lines 610a and 610b may be routed in various ways. For example, the self-test current lines 610a and 610b may be routed together to form a self-test loop around the TMR sense element 211. Preferably, the magnetic field generated by the self-test loop is along the sensor response direction. For example, the magnetic field generated by the self-test loop of a Z-axis magnetic sensor is either positively or negatively aligned to the Z-axis. However, for extraction of cross-axis effects or axis orthogonality measurements, it is desirable for the self-test fields to be applied in two or more orthogonal directions in each sensor.

Figure 4A:
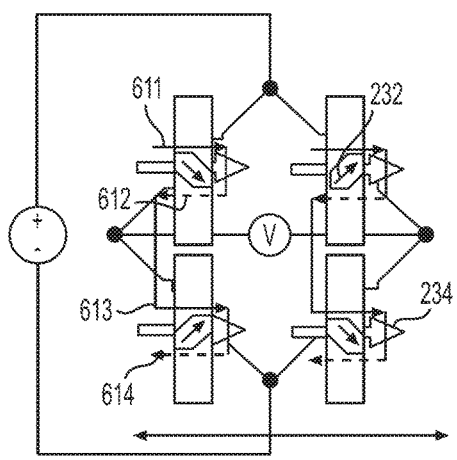
FIGS. 4A-4B depict exemplary diagrams of bridge circuits for measurement of X- or Y-axes of a magnetic field, with self-test current lines according to various embodiments of the inventions.
Figure 4B:
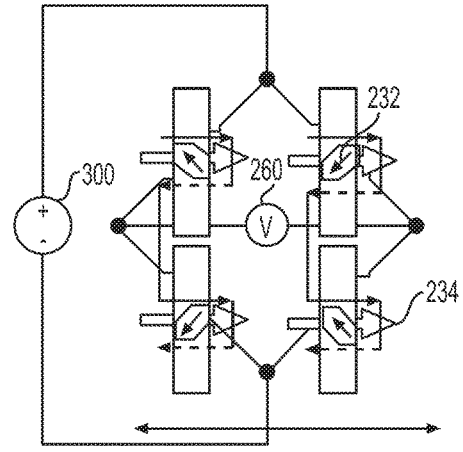

FIGS. 4A and 4B illustrate exemplary diagrams of bridge circuits for measurement of X- or Y-axes of a magnetic field, with self-test current lines, according to various embodiments of the inventions. When a current pulse is applied to the current line 410, a magnetic field pulse orients the magnetization direction 232 of the first ferromagnetic layer. Depending on the polarity of the applied current pulse, the generated magnetic field switches the free layer magnetization direction 232 to have a component that is positively or negatively aligned to the reference magnetization direction 234 of the second ferromagnetic layer. FIG. 4A shows a generally positively aligned magnetization direction 232 in the first ferromagnetic layer 212, and FIG. 4B shows a generally negatively aligned magnetization direction 232 in the first ferromagnetic layer 212.

The self-test current lines 611, 612, 613, and 614 are routed together to form a multiple-turn self-test current loop around the bridge circuit. The self-test current lines 611 and 613 (solid lines) are located, disposed, or deposited above the first ferromagnetic layer 212, and the self-test current lines 612 and 614 (dashed lines) are located, disposed, or deposited beneath the second ferromagnetic layer 214. The multiple-turn self-test current loop generates a magnetic field along X- or Y-axes (for a X- or Y-axis magnetic sensor). Besides the routing shown in FIGS. 4A and 4B, the self-test current lines 611, 612, 613, and 614 may be routed in other patterns. For example, the self-test current lines 611 and 613 (solid lines) located, disposed, or deposited above the first ferromagnetic layer 212 may be connected together. The self-test current lines 612 and 614 (dashed lines) located, disposed, or deposited below the second ferromagnetic layer 214 may be connected together.

Figure 5A:
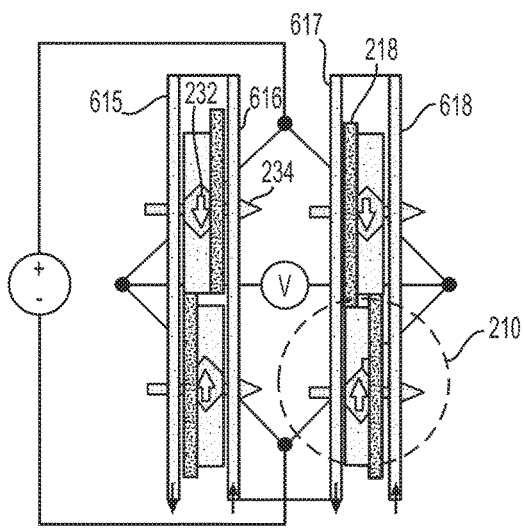
FIGS. 5A-5B depict exemplary diagrams of bridge circuits for measurement of a Z-axis magnetic field, with self-test current lines according to various embodiments of the inventions.
Figure 5B:
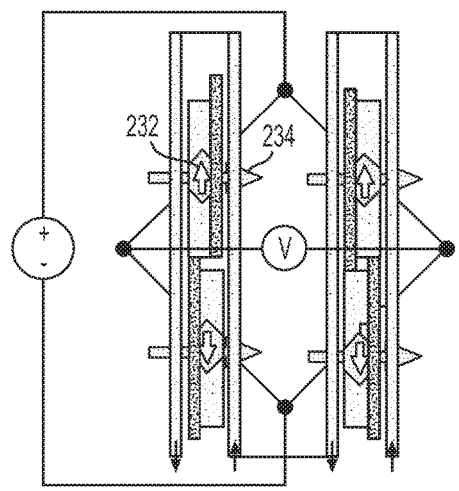

FIGS. 5A and 5B illustrate exemplary diagrams of bridge circuits for measurement of a Z-axis of a magnetic field, with self-test current lines, according to various embodiments of the inventions. For Z-axis magnetic sensing, each TMR sense element 211 of a transducer leg 210 integrates at least one flux guide 218. For example, each Z-axis TMR transducer leg 210 comprise an array of Z-axis TMR sense elements, and each Z-axis TMR sense element may comprise at least one flux guide. It is understood that the flux guide 218 shown in FIGS. 5A and 5B are only for a general illustration purpose. It is referred as a collection of the flux guides within each TMR transducer leg 210.

A single TMR transducer leg 210 for Z-axis magnetic measurement may also comprise self-test current lines (such as self-test current lines 615, 616, 617, and/or 618) on one or both sides of the flux guide 218. The self-test lines 615 and 616 (also applicable to self-test current lines 617 and 618) are formed parallel to the flux guides 218, and preferably equidistant from the first ferromagnetic layer 212. The self-test lines 615-618 are a conductive material, for example, copper (Cu) or aluminum (Al). While the self-test lines 615-618 are illustrated as four lines, it is understood they could be one integrated line, or another sub-grouping of series and parallel routed lines for optimal power and voltage requirements as dictated by the device. Also, as the self-test lines 615 and 616 are equidistant from the first ferromagnetic layer 212, the lateral (X or Y) components of the generated magnetic fields at the first ferromagnetic layer 212 are of equal value and with opposite directions, therefore netting zero at the sense element center. The self-test current lines 615, 616, 617, and 618 generate a magnetic field along Z-axis.

As illustrated in FIGS. 5A and 5B, the self-test current lines 615, 616, 617, and 618 are routed together to form a multiple-path self-test current loop near the bridge circuit. Besides the routing way shown in FIGS. 5A and 5B, the self-test current lines 615, 616, 617, and 618 may be routed in other patterns. For example, the self-test current lines 615 and 617 (with the same current direction) may be connected together, and the self-test current lines 616 and 618 may be connected together.

Figure 6:
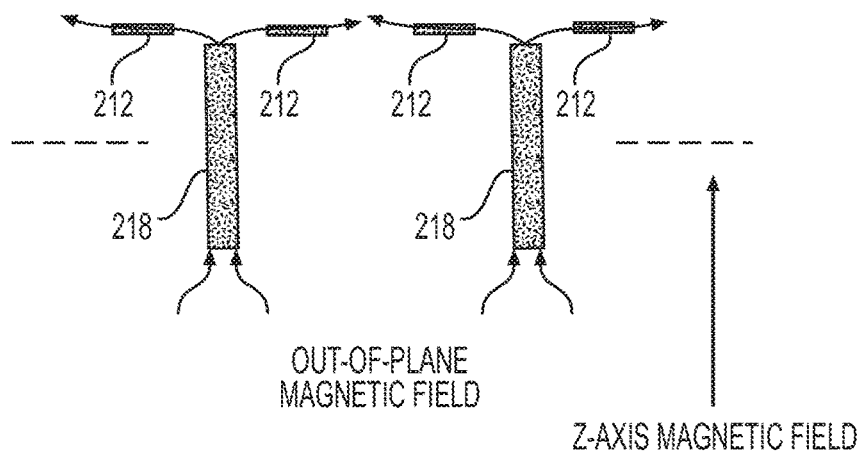
FIG. 6 shows a cross-section view of TMR sense elements and flux guides for Z-axis TMR sense element cells according to various embodiments of the inventions.

A detailed cross-section view of TMR sense elements and flux guides for typical Z-axis TMR sense elements is shown in FIG. 6. The cross-section view extends to multiple TMR sense elements. For clarity, some components such as the second ferromagnetic layer 214, the insulating tunnel barrier 216, etc., are not shown in FIG. 6. The flux guide 218 is a high aspect ratio vertical bar made from a high permeability magnetic material with ends terminating in close proximity to opposed edges of the magnetic sense element (the first ferromagnetic layer 212). Although the flux guides 218 are shown below the first ferromagnetic layer 212 in FIG. 6, the flux guide(s) may also be located, disposed, or deposited above the first ferromagnetic layer 212. The flux guides 218 capture magnetic flux from an applied field oriented in the Z-axis direction, and bend the field lines to have a horizontal component near the ends of the flux guides 218. The first ferromagnetic layer 212 responds only to in-plane magnetic fields, and therefore, does not respond to a Z-axis magnetic field directly. The flux guides 218 bend the Z-axis magnetic field into a horizontal direction such that the first ferromagnetic layer 212 may respond accordingly.

Figure 7A:
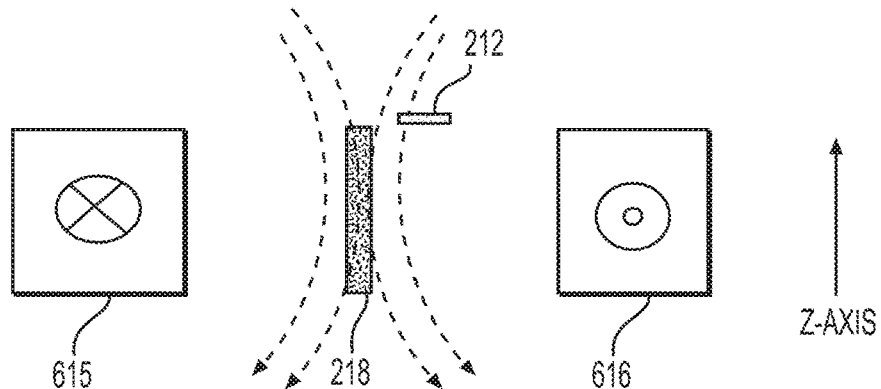
FIGS. 7A-7B show cross-section views of self-test coils and a flux guide within a Z-axis TMR sense element cell according to various embodiments of the inventions.
Figure 7B:
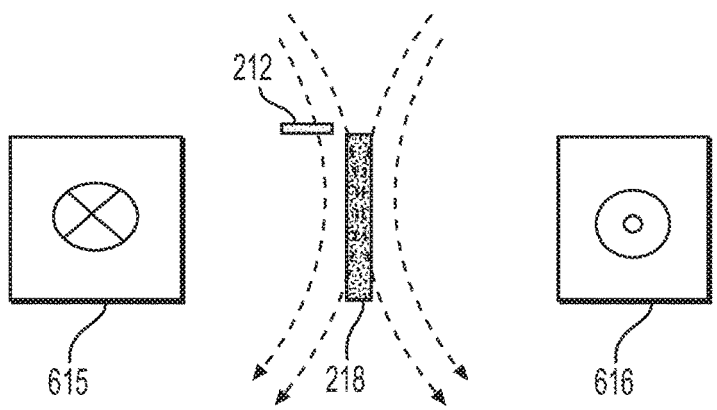

FIGS. 7A and 7B show cross-section views of self-test coils and a flux guide within a Z-axis TMR sense element, according to various embodiments of the inventions. The self-test current lines 615 and 616 are preferably arranged in the same plane as the flux guide 218 within a Z-axis sense element. The sense element may be in the middle between the two self-test lines 615 and 616 for elimination of all in-plane fields at the sense element due to system symmetries. Alternatively, the flux guide 218 may be in the middle between self-test current lines 615 and 616. This leads to a higher Z-axis field that gets coupled in the flux guide 218, leading to a higher field factor, which may be beneficial in using self-testing coils with smaller size to achieve the same magnetic field bending effects. The current line 615 has inward current direction and the current line 616 has outward current direction. Such configuration generates a negative Z-axis direction self-test magnetic field. It is understood that the current directions in current lines 615 and 616 may be the opposite of that shown in FIGS. 7A-7B, which will then generate a positive Z-axis direction self-test magnetic field.

The self-test line pairs are not necessarily centered around the sense element (the first ferromagnetic layer 212 is shown), thus providing flexibility for sensor design. FIG. 7A shows that the first ferromagnetic layer 212 is closer in distance to the current line 616, and FIG. 7B shows that the first ferromagnetic layer 212 is closer in distance to the current line 615. The self-test coil is designed to achieve a constant, consistent field and field direction over all sense elements in the Z-axis sensor area, while ensuring that the self-test current and voltage are within limits of the drive circuit process limitations.

Figure 8A:
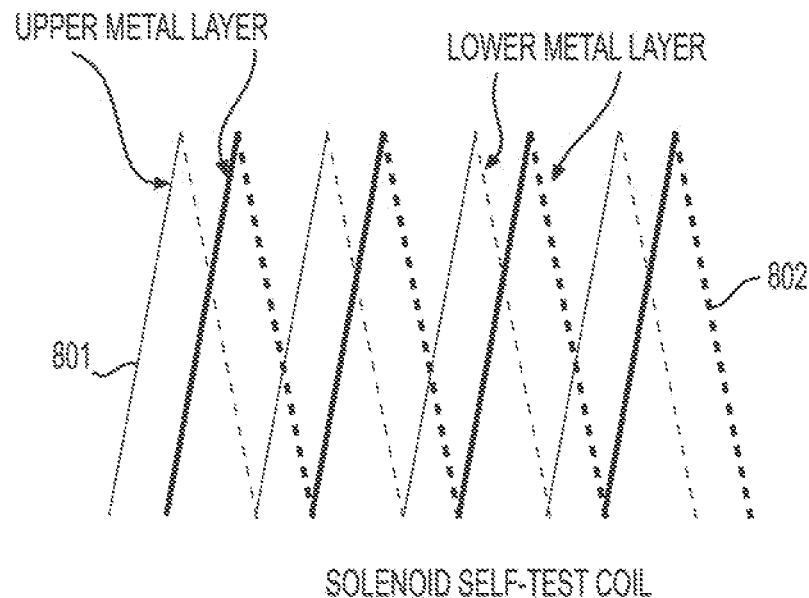
FIGS. 8A-8B show exemplary diagrams of various self-test coil layouts according to various embodiments of the inventions.
Figure 8B:
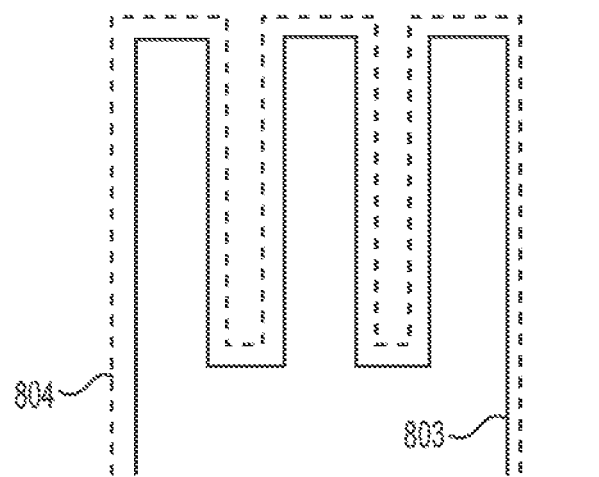

The self-test coil in the sensor is used to generate controlled fields that are used to test the sensor's performance for a wafer/die level test. These tests require self-test fields up to at least the full (linear) range of the sensors. The self-test coil in the sensor may also be used to calibrate the sensor and mitigate the effects of any spurious offset fields in the final device and location where it is mounted. The self-test field in this mode is a fraction of the full range of the sensor, and there are severe power constraints on the system as the sensor could be deployed in a power sensitive device. The design requirements from the self-test coils for the two modes of operation are different and using the same self-test coil for both modes impose severe constraints on self-test coil design due to system power/voltage limits. FIGS. 8A and 8B show exemplary diagrams of various self-test coil layouts, according to various embodiments of the inventions.

In FIGS. 8A and 8B, the self-test coils are split into multiple interleaved coils that are connected in parallel. The parallel coils may be solenoid coils encircling across multiple TMR sense elements, shown as coil 801 and coil 802 in FIG. 8A. The parallel coils may also be planar coils extending across multiple TMR sense elements, shown as coil 803 and coil 804 in FIG. 8B. A fraction of the coils 801-804 or only selected turns of the coils 801-804 are used during the in-situ calibration routine when there are severe power constraints on the system. The fraction percentage of the coils for calibration may be fixed or variable based on need. Moreover, the locations of the turns for calibration may also be fixed or variable based on need. During wafer/die level testing when generating a high field is crucial and there are no constraints on the voltage/power budget, all the coils (or a larger number of coil turns) are used for the generation of a desired self-test magnetic field. Similarly, a subset of self-test coils only exciting a subsection of the transducer array may be utilized for in-situ calibration, while the full array of self-test coils or substantial part of the array of self-test coils may be energized during wafer/die level testing.

One skilled in the art will recognize that various implementations may be realized within the described architecture, all of which fall within the scope of the inventions. For example, various self-test current routing and energizing patterns may be implemented to provide a high field factor and desired self-test magnetic field output. The self-test coils may not be limited to the aforementioned solenoid coils or the planar coils.

The foregoing description of the inventions has been described for purposes of clarity and understanding. It is not intended to limit the inventions to the precise form disclosed. Various modifications may be possible within the scope and equivalence of the application.

What is claimed is:
1. A magnetic field sensor, comprising:
   a plurality of magnetoresistance sense elements coupled together as a bridge circuit to sense a magnetic field; and a first circuit comprising a first plurality of current lines, wherein the first plurality of current lines is configured to selectively conduct current in a series configuration and in a parallel configuration, wherein the first circuit includes circuitry to selectively energize the first plurality of current lines in series in a first instance and in parallel in a second instance, wherein each current line of the first plurality of current lines is adjacent to a magnetoresistance sense element of the plurality of magnetoresistance sense elements, wherein, when energized, at least one current line of the first plurality of current lines is configured to generate an induced magnetic field sensed by the bridge circuit, and wherein the first circuit is configured to selectively energize, in series in the first instance and in parallel in the second instance, the at least one current line and another current line of the first plurality of current lines of the first circuit.

2. The magnetic field sensor of claim 1, wherein the at least one current line and the another current line includes the entirety of the first plurality of current lines.

3. The magnetic field sensor of claim 1, wherein one or more current lines of the first plurality of current lines are routed to form a coil around at least one magnetoresistance sense element of the plurality of magnetoresistance sense elements.

4. The magnetic field sensor of claim 1, wherein one or more current lines of the first plurality of current lines are routed to form a coil extending across at least one magnetoresistance sense element of the plurality of magnetoresistance sense elements.

5. The magnetic field sensor of claim 1, wherein one or more current lines of the first plurality of current lines are routed to form a loop around at least one magnetoresistance sense element of the plurality of magnetoresistance sense elements.

6. The magnetic field sensor of claim 1, wherein each magnetoresistance sense element of the plurality of magnetoresistance sense elements includes a first ferromagnetic layer and a second ferromagnetic layer separated by a non-magnetic, insulating barrier, and
wherein the first ferromagnetic layer of each magnetoresistance sense element includes a magnetization direction free to rotate in a magnetic field, and wherein the second ferromagnetic layer of each magnetoresistance sense element includes a fixed magnetization direction.

7. The magnetic field sensor of claim 1, wherein the plurality of magnetoresistance sense elements includes one or more tunneling magnetoresistance sense elements, giant magnetoresistance sense elements, and/or anisotropic magnetoresistance sense elements.

8. The magnetic field sensor of claim 1, further comprising:
a current source connection that connects a current source to the first circuit for selectively energizing the at least one current line of the first plurality of current lines.

9. The magnetic field sensor of claim 1, further comprising:
a second circuit comprising a second plurality of current lines, wherein each current line of the second plurality of current lines is adjacent to a magnetoresistance sense element of the plurality of magnetoresistance sense elements;
a first current source connection that connects a first current source to the first circuit; and
a second current source connection that connects a second current source to the second circuit.

10. The magnetic field sensor of claim 1, wherein at least one magnetoresistance sense element of the plurality of magnetoresistance sense elements includes at least one flux guide.

11. The magnetic field sensor of claim 10, wherein the at least one flux guide is a vertical bar comprising a high permeability magnetic material with an end terminating proximate to an edge of the respective magnetoresistance sense element.

12. The magnetic field sensor of claim 10, wherein the at least one flux guide is located below the respective magnetoresistance sense element.

13. The magnetic field sensor of claim 1, further comprising:
a second plurality of magnetoresistance sense elements coupled together as a second bridge circuit to sense a magnetic field; and
a second circuit comprising a second plurality of current lines, wherein each current line of the second plurality of current lines is adjacent to a magnetoresistance sense element of the second plurality of magnetoresistance sense elements, wherein, when energized, at least one current line of the second plurality of current lines is configured to generate a second induced magnetic field sensed by the second bridge circuit, and wherein the second circuit is configured to selectively energize, in parallel or in series, the at least one current line and another current line of the second plurality of current lines of the second circuit,
wherein the first bridge circuit is configured to sense the magnetic field in a first direction, and the second bridge circuit is configured to sense the magnetic field in a second direction that is orthogonal to the first direction.

14. The magnetic field sensor of claim 13, wherein the second direction extends out of a plane formed by the second plurality of magnetoresistance sense elements.

15. The magnetic field sensor of claim 13, further comprising:
a third plurality of magnetoresistance sense elements coupled together as a third bridge circuit to sense a magnetic field in a third direction, wherein the third direction is orthogonal to the first and second directions; and
a third circuit comprising a third plurality of current lines, wherein each current line of the third plurality of current lines is adjacent to a magnetoresistance sense element of the third plurality of magnetoresistance sense elements, wherein, when energized, at least one current line of the third plurality of current lines is configured to generate a third induced magnetic field sensed by the third bridge circuit, and wherein the third circuit is configured to selectively energize, in parallel or in series, the at least one current line and another current line of the third plurality of current lines of the third circuit.

16. A magnetic field sensor, comprising:
a plurality of magnetoresistance sense elements coupled together as a bridge circuit to sense a magnetic field in a first direction;
a first circuit comprising a first plurality of current lines, wherein each current line of the first plurality of current lines is adjacent to a magnetoresistance sense element of the plurality of magnetoresistance sense elements, wherein, when energized, at least one current line of the first plurality of current lines is configured to generate an induced magnetic field sensed by the bridge circuit, and wherein the induced magnetic field includes an in-plane component and an out-of-plane component, and at least one flux guide, wherein the at least one flux guide is a vertical bar comprising a high permeability magnetic material with an end terminating proximate to an edge of at least one magnetoresistance sense element of the plurality of magnetoresistance sense elements, wherein the at least one flux guide is located between the at least one current line and another current line of the plurality of current lines, and wherein, when the at least one current line and the another current line of the plurality of current lines are energized, the in-plane component of the induced magnetic field at the at least one sense element is eliminated.

17. The magnetic field sensor of claim 16, wherein, when energized, the at least one current line and the another current line are configured to generate the induced magnetic field oriented orthogonally to a plane of the plurality of magnetoresistance sense elements.

18. The magnetic field sensor of claim 17, wherein the at least one current line and the another current line are configured to eliminate in-plane magnetic fields at each of the plurality of magnetoresistance sense elements.

19. The magnetic field sensor of claim 18, wherein the first circuit is configured to selectively energize, in parallel or in series, the at least one current line and the another current line of the first plurality of current lines of the first circuit.

20. A magnetic field sensor, comprising:

a plurality of magnetoresistance sense elements coupled together as a bridge circuit to sense a magnetic field;

a first circuit comprising a first plurality of current lines, wherein each current line of the first plurality of current lines is adjacent to a magnetoresistance sense element of the plurality of magnetoresistance sense elements, wherein, when energized, at least one current line of the first plurality of current lines is configured to generate an induced magnetic field sensed by the bridge circuit, wherein the induced magnetic field includes an in-plane component and an out-of-plane component, and wherein the first circuit is configured to selectively energize the at least one current line and another current line of the first plurality of current lines of the first circuit, and at least one flux guide, wherein the at least one flux guide comprises a high permeability magnetic material with an end terminating proximate to an edge of at least one magnetoresistance sense element of the plurality of magnetoresistance sense elements, and wherein, when the at least one current and the another current line of the plurality of current lines are energized, the in-plane component of the induced magnetic field at the at least one sense element is eliminated.

* * * * *